(12) United States Patent
Maheshwari

(10) Patent No.: US 9,361,973 B2
(45) Date of Patent: Jun. 7, 2016

(54) MULTI-CHANNEL, MULTI-BANK MEMORY WITH WIDE DATA INPUT/OUTPUT

(71) Applicant: Cypress Semiconductor Corporation, San Jose, CA (US)

(72) Inventor: Dinesh Maheshwari, Fremont, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/228,899

(22) Filed: Mar. 28, 2014

(65) Prior Publication Data

US 2015/0117091 A1    Apr. 30, 2015

Related U.S. Application Data

(60) Provisional application No. 61/912,509, filed on Dec. 5, 2013, provisional application No. 61/896,334, filed on Oct. 28, 2013.

(51) Int. Cl.
| | |
|---|---|
| *G11C 7/18* | (2006.01) |
| *G11C 11/413* | (2006.01) |
| *G11C 7/10* | (2006.01) |
| *G11C 11/419* | (2006.01) |
| *G11C 5/02* | (2006.01) |
| *G11C 8/12* | (2006.01) |

(52) U.S. Cl.
CPC ............ *G11C 11/413* (2013.01); *G11C 7/1075* (2013.01); *G11C 11/419* (2013.01); *G11C 5/025* (2013.01); *G11C 7/18* (2013.01); *G11C 8/12* (2013.01); *G11C 2207/2209* (2013.01)

(58) Field of Classification Search
CPC .... G11C 11/41; G11C 11/413; G11C 7/1075; G11C 11/419; G11C 8/12

USPC ................ 365/154, 189.05, 189.03, 189.18; 710/305

See application file for complete search history.

(56) References Cited

U.S. PATENT DOCUMENTS

| | | | |
|---|---|---|---|
| 5,247,637 A | | 9/1993 | Leedom et al. |
| 5,487,155 A | | 1/1996 | Drewry et al. |
| 5,592,610 A | * | 1/1997 | Chittor ..................... 714/4.12 |
| 5,781,918 A | * | 7/1998 | Lieberman et al. ............. 711/5 |
| 5,870,350 A | | 2/1999 | Bertin et al. |

(Continued)

FOREIGN PATENT DOCUMENTS

EP          1364298 B1    8/2013

OTHER PUBLICATIONS

Zhu, Zhichun, "A Performance Comparison of DRAM Memory System Optimizations for SMT Processors," Proceedings of the 11th International Symposium on High-Performance Computer Architecture, San Francisco, CA, Feb. 2005, pp. 213-224.

(Continued)

*Primary Examiner* — Douglas King

(57) ABSTRACT

An integrated circuit (IC) can include M memory banks, where M is greater than 2, and each memory bank is separately accessible according to a received address value; N channels, where N is greater than 2, and each channel includes its own a data connections, address connections, and control input connections for executing a read or write access to one of the memory banks in synchronism with a clock signal; and a controller subsystem configured to control accesses between the channels and the memory banks, including up to an access on every channel on consecutive cycles of the clock signal.

14 Claims, 8 Drawing Sheets

(56) References Cited

U.S. PATENT DOCUMENTS

| | | | |
|---|---|---|---|
| 6,006,318 | A | 12/1999 | Hansen et al. |
| 6,330,185 | B1 | 12/2001 | Wong et al. |
| 6,944,731 | B2 | 9/2005 | Bouchard et al. |
| 6,988,152 | B2 * | 1/2006 | Walton et al. ............ 710/56 |
| 6,988,154 | B2 | 1/2006 | Latta |
| 7,050,324 | B2 | 5/2006 | Cummings et al. |
| 7,080,283 | B1 | 7/2006 | Songer et al. |
| 7,120,765 | B2 | 10/2006 | Dodd et al. |
| 7,246,215 | B2 | 7/2007 | Lu et al. |
| 7,830,735 | B2 | 11/2010 | Ware et al. |
| 7,970,990 | B2 | 6/2011 | Forrest et al. |
| 8,120,989 | B2 | 2/2012 | Chen et al. |
| 8,261,039 | B2 | 9/2012 | Perego et al. |
| 8,266,372 | B2 | 9/2012 | Gillingham et al. |
| 8,285,960 | B2 | 10/2012 | Pyeon et al. |
| 8,464,001 | B1 | 6/2013 | Edmondson et al. |
| 8,484,397 | B1 | 7/2013 | Srinivasan et al. |
| 2003/0217244 | A1 * | 11/2003 | Kelly ............ 711/168 |
| 2006/0221945 | A1 | 10/2006 | Chin et al. |
| 2007/0150667 | A1 | 6/2007 | Bains et al. |
| 2008/0137461 | A1 * | 6/2008 | Pyeon et al. ............ 365/219 |
| 2010/0036997 | A1 | 2/2010 | Brewer et al. |
| 2011/0219197 | A1 | 9/2011 | Perego et al. |
| 2012/0007873 | A1 | 1/2012 | Margulis |
| 2012/0008378 | A1 | 1/2012 | Maheshwari |
| 2012/0030396 | A1 | 2/2012 | Zhu et al. |
| 2012/0112352 | A1 | 5/2012 | Chi et al. |
| 2012/0210041 | A1 | 8/2012 | Flynn et al. |
| 2013/0058145 | A1 | 3/2013 | Yu et al. |
| 2013/0063918 | A1 | 3/2013 | Haba et al. |
| 2013/0292840 | A1 | 11/2013 | Shoemaker et al. |
| 2014/0003115 | A1 | 1/2014 | Lee et al. |

OTHER PUBLICATIONS

U.S. Appl. No. 14/229,765: "Multi-Channel Physical Interfaces and Methods for Static Random Access Memory Devices," Dinesh Maheshwari et al., filed Mar. 28, 2014; 39 pages.

Hanlon, et al., "Emulating a large memory sequential machine with a collection of small memory ones"; Cornell University; Publication [online]. Oct. 2012 [retrieved Jan. 8, 2015]. Retrieved from innternet:<URL:http://arxiv.org/abs/1210.1158>; pp. 4-6.

International Search Report for International Application No. PCT/US14/62552 dated Jan. 23, 2015; 2 pages.

Raghavan, G., Five Emerging DRAM Interfaces You Should Know for Your Next Design, Cadence Design Systems, 2013.

USPTO Final Rejection for U.S. Appl. No. 14/229,765 dated Jun. 23, 2015; 12 pages.

USPTO Final Rejection for U.S. Appl. No. 14/229,765 dated Nov. 6, 2014; 11 pages.

USPTO Non-Final Rejection for U.S. Appl. No. 14/229,765 dated Mar. 2, 2015; 10 pages.

USPTO Non-Final Rejection for U.S. Appl. No. 14/229,765 dated Jul. 28, 2014; 10 pages.

USPTO Notice of Allowance for U.S. Appl. No. 14/229,765 dated Aug. 26, 2015; 5 pages.

Written Opinion of the International Searching Authority for International Application No. PCT/US2014/62552 mailed Jan. 23, 2015; 6 pages.

* cited by examiner

1406(16)

| | |
|---|---|
| DW3-D2 | DW3-H2 |
| DW3-C2 | DW3-G2 |
| | |
| AW2, ChD2 | AW2, ChH2 |
| DW2-D2 | DW2-H2 |
| DW2-C2 | DW2-G2 |
| AW1, ChD1 | AW1, ChH1 |
| AW2, ChC2 | AW2, ChG2 |
| DW1-D1 | DW1-H1 |
| DW1-C1 | DW1-G1 |
| AW1, ChC1 | AW1, ChG1 |
| | |
| DW0-D1 | DW0-H1 |
| DW0-C1 | DW0-G1 |
| | |
| MIDSTACK 1480 | |
| | |
| DW3-B2 | DW3-F2 |
| DW3-A2 | DW3-E2 |
| | |
| AW1, ChB2 | AW2, ChF2 |
| DW2-B2 | DW2-F2 |
| DW2-A2 | DW2-E2 |
| AW1, ChB1 | AW2, ChF1 |
| AW2, ChA2 | AW2, ChE2 |
| DW1-B1 | DW1-F1 |
| DW1-A1 | DW1-E1 |
| AW1, ChA1 | AW1, ChE1 |
| | |
| DW0-B1 | DW0-F1 |
| DW0-A1 | DW0-E1 |
| | |

| | |
|---|---|
| AW3, ChD3 | AW3, ChH3 |
| DW3-D3 | DW3-H3 |
| DW3-C3 | DW3-G3 |
| AW3, ChC3 | AW3, ChG3 |
| AW2, ChD2 | AW2, ChH2 |
| DW2-D2 | DW2-H2 |
| DW2-C2 | DW2-G2 |
| AW1, ChD1 | AW1, ChH1 |
| AW2, ChC2 | AW2, ChG2 |
| DW1-D1 | DW1-H1 |
| DW1-C1 | DW1-G1 |
| AW1, ChC1 | AW1, ChG1 |
| AW0, ChD0 | AW0, ChH0 |
| DW0-D0 | DW0-H0 |
| DW0-C0 | DW0-G0 |
| AW2, ChC0 | AW2, ChG0 |
| MIDSTACK 1480 | |
| AW3, ChB3 | AW3, ChF3 |
| DW3-B3 | DW3-F3 |
| DW3-A3 | DW3-E3 |
| AW3, ChA3 | AW3, ChE3 |
| AW1, ChB2 | AW2, ChF2 |
| DW2-B2 | DW2-F2 |
| DW2-A2 | DW2-E2 |
| AW1, ChB1 | AW2, ChF1 |
| AW2, ChA2 | AW2, ChE2 |
| DW1-B1 | DW1-F1 |
| DW1-A1 | DW1-E1 |
| AW1, ChA1 | AW1, ChE1 |
| AW0, ChB0 | AW0, ChF0 |
| DW0-B0 | DW0-F0 |
| DW0-A0 | DW0-E0 |
| AW0, ChA0 | AW0, ChE0 |

FIG. 14C

MULTI-CHANNEL, MULTI-BANK MEMORY WITH WIDE DATA INPUT/OUTPUT

This application claims the benefit of U.S. Provisional Patent Application No. 61/896,334, filed Oct. 28, 2013, and U.S. Provisional Patent Application No. 61/912,509, filed Dec. 5, 2013, the contents all of which are incorporated by reference herein.

TECHNICAL FIELD

The present disclosure relates generally to integrated circuit (IC) memory devices, and more particularly to IC memory devices having multiple banks and multiple channels.

BACKGROUND

A random transaction rate (RTR) of a memory device can be an important feature for many applications. While the raw Random Transaction Rate (RTR) of the memory device is determined by the address rate of arrays within the memory device, the total transaction rate of a device is determined by the number of banks in the array and the number of addresses and data word transfers supported by the interface.

One type of memory having a fast RTR is a quad data rate (QDR) static random access memory (SRAM). Conventional QDR SRAMs can support two addresses and data word transfers per interface cycle (i.e., two channels) to access two banks in the array ("QDR-IV"). However, for many applications, conventional QDR SRAM do not provide a desired RTR.

One conventional way to increase RTR can be to embed an SRAM memory into an IC that executes the desired application. However, such approaches may not provide adequate storage for an application, may result in reduced yield for the IC, and/or may add to fabrication complexity and/or cost.

BRIEF DESCRIPTION OF THE DRAWINGS

FIG. 13 is a plan view of a high band width dynamic random access memory (HBM DRAM) interface according to an embodiment.

FIGS. 14A to 14C are plan views of an HBM compatible SRAM interface that can be included in embodiments.

DETAILED DESCRIPTION

Figure 1:
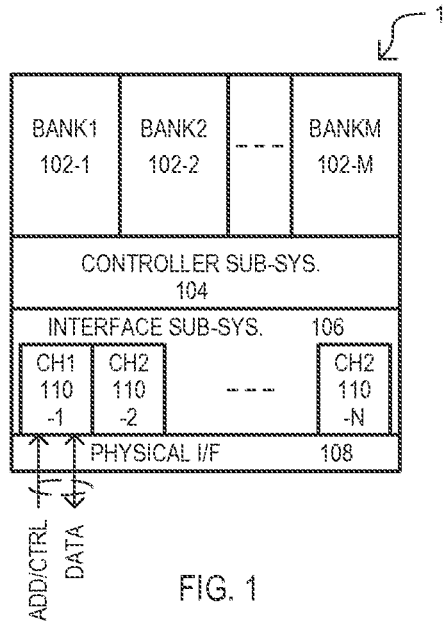
FIG. 1 is a block diagram of an integrated circuit (IC) according to one embodiment.

Various embodiments will now be described that show memory integrated circuits (ICs) and IC devices in which a large number of memory banks (i.e., more than two) can be accessed by a large number of channels via a wide input/output (IO) interface, for very high random transaction rates (RTR). In some embodiments, such an IC can have multiple channels connected to multiple banks via a crossbar type arrangement to enable access to any memory bank from any channel. In addition or alternatively, such an IC can have a memory cache divided according to memory bank, to enable retrieval or cached write data as read data when a read addresses matches a cached write address.

In still other embodiments, such an IC device can have a fine pitched physical interface suitable for connection with an interposer in multi-chip module type IC device. In particular embodiments, such an interface can have no less than 1000 data connections.

In the various embodiments described below, like items are referred to the same reference characters but with the leading digit(s) corresponding to the figure number.

FIG. 1 is a block diagram of an integrated circuit (IC) device 100 according to an embodiment. In some embodiments, IC device 100 can be formed in a substrate. However, in other embodiments, different sections of IC device 100 can be formed on different substrates, but assembled into a common IC device package (e.g., multi-chip module). An IC device 100 can include a number of memory banks 102-1 to 102-M, a controller sub-system 104, an interface sub-system 106, and physical interface 108. Each memory bank (102-1 to 102-M) can include a number of memory cells for storing data, and each memory bank can be separately addressable. That is, a transaction (e.g., read or write) to one memory bank can be separate from a transaction to any other memory bank. The number of memory banks (M) can be greater than two, and in particular embodiments, can be four, eight or sixteen.

In particular embodiments, memory banks (102-1 to 102-M) can be formed of static random access memory (SRAM) cells. In some embodiments, each memory bank can store no less than 36 megabits (Mb).

An interface sub-system 106 can include multiple channels 110-1 to 110-N for accessing data in memory banks (102-1 to 102-M). Each channel can include its own address bus, data bus, and control bus. Thus, separate transactions to the memory bank (102-1 to 102-M) can be executed from each different channel (110-1 to 110-N). Accordingly, while FIG. 1 shows address, control and data buses only for channel 110-1, it is understood that all channels (110-2 to 110-N) have their own, separate address, control and data buses. The number of channels (N) can be greater than two, and in particular embodiments can be four, eight, 16 or 32. In particular embodiments, an interface sub-system is configurable to provide between four to 32 different channels.

A controller sub-system 104 can include circuits for enabling accesses to the memory banks (102-1 to 102-M) via the channels (110-1 to 110-N). In one embodiment, the controller sub-system 104 can be configured to connect any channel to any memory bank. That is, any of the N channels can access any of the M memory banks. However, in other embodiments, channel to memory bank can be more restricted. For example, each channel may have access to less than M memory banks, including only one memory bank.

A physical interface 108 can provide physical connections for the various buses of the channels (110-1 to 110-N). Accordingly, a physical interface 108 can include physical connects (e.g., pad, pins, bumps, balls etc.) to enable signals to reach the IC device 100 and be output from the IC device 100.

Figure 2:
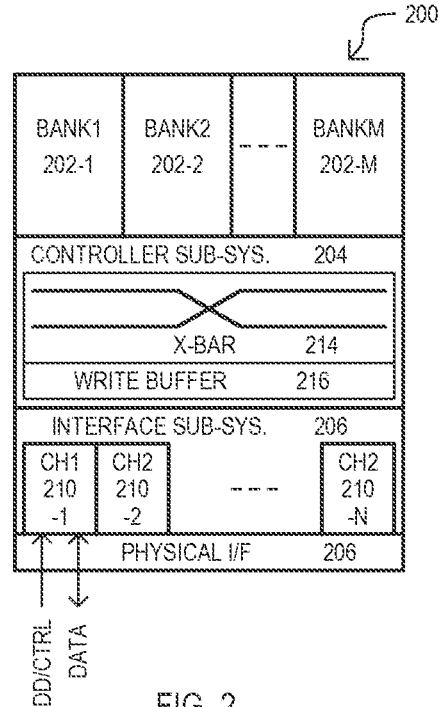
FIG. 2 is a block diagram of an IC according to another embodiment.

FIG. 2 is a block diagram of an IC device 200 according to another embodiment. IC device 200 can include items like those of FIG. 1, and such like items can be subject to the same variations as their counterpart of FIG. 1. In a particular embodiment, IC device 200 can be one implementation of that shown in FIG. 1.

FIG. 2 differs from FIG. 1 in that a controller sub-system 204 can include a crossbar circuit 214 and a write cache 216. A crossbar circuit 214 can include switch paths that enable values on address, control and data buses to be transferred between a corresponding channel (210-1 to 210-N) and memory bank (202-1 to 202-M). In one embodiment, in response to bank address information received on a channel, controller sub-system 204 can generate controls signals for crossbar circuit 214 that connect data (i.e., address, control and write data, if a write operation) to the indicated bank. In a very particular embodiment, all or a portion of the channel address bus can be connected to decoders in the memory bank, data on a channel control bus can be connected to control inputs (e.g., read enable, write enable) of the memory bank, and a channel data bus can be connected to inputs/outputs (IOs) of the memory bank. In some embodiments, operations can be performed on data between the crossbar circuit 214 and the channels (e.g., bit inversion, error correction).

A write cache 216 can buffer write data values prior to such data values being written into memory banks (202-1 to 202-M). In some embodiments, a write cache 216 can store write data and addresses for write data received in the last X cycles, where X is proportional to a read latency of the IC. When a read operation is directed to one of the cached write addresses, the write cache 216 can provide the cached write data as read data.

Figure 3:
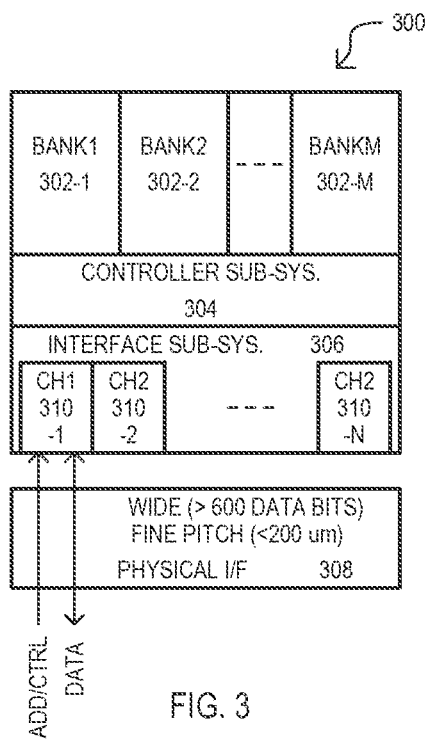
FIG. 3 is a block diagram of an IC according to a further embodiment.

FIG. 3 is a block diagram of an IC 300 according to another embodiment. IC 300 can include items like those of FIG. 1, and such like items can be subject to the same variations as their counterpart of FIG. 1. In a particular embodiment, IC 300 can be one implementation of that shown in FIG. 1.

FIG. 3 differs from FIG. 1 in that a physical interface is described as a "wide" and "fine pitch" interface. A wide interface can provide a relatively large number of data IO physical connections. In the embodiment shown, a wide IO can have more than 600 data IO connections (not including address and control inputs). Further, most of such data IO connections can have a pitch of less than 200 microns (um). In some embodiments, such a pitch can be less than 100 um. In some embodiments, there can be no fewer than 400 connections within a distance of one millimeter.

Figure 4:
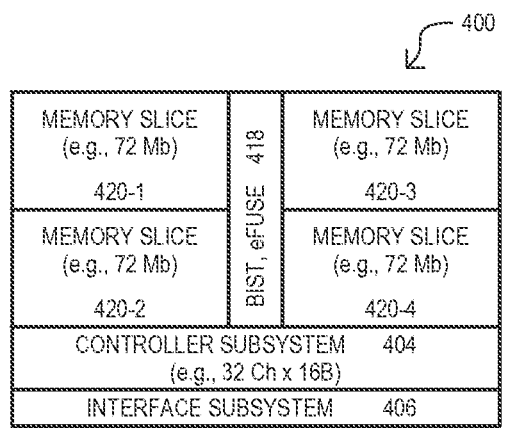
FIG. 4 is a block diagram of an IC according to another embodiment.

FIG. 4 is a block diagram of an IC 400 according to another embodiment. IC 400 can include items like those of FIG. 1, and such like items can be subject to the same variations as their counterpart of FIG. 1. In a particular embodiment, IC 400 can be one implementation of that shown in FIG. 1.

Unlike FIG. 1, FIG. 4 shows memory "slices" 420-1 to 420-3. Memory slices (420-1 to 420-3) can be a physical ordering of memory banks. Thus, each memory slice (420-1 to 420-3) can include multiple banks. In one particular embodiment, each memory slice (420-1 to 420-3) can have an effective storage size of 72 Mb of SRAM storage.

In FIG. 4, a controller sub-system 404 can enable any of 32 channels to connect to any of 16 banks. FIG. 4 also shows ancillary circuit 418, including built-in self-test (BIST) circuits and fusible links for configuring the IC 400 and/or implementing features of the IC (e.g., redundancy or the like).

Figure 5:
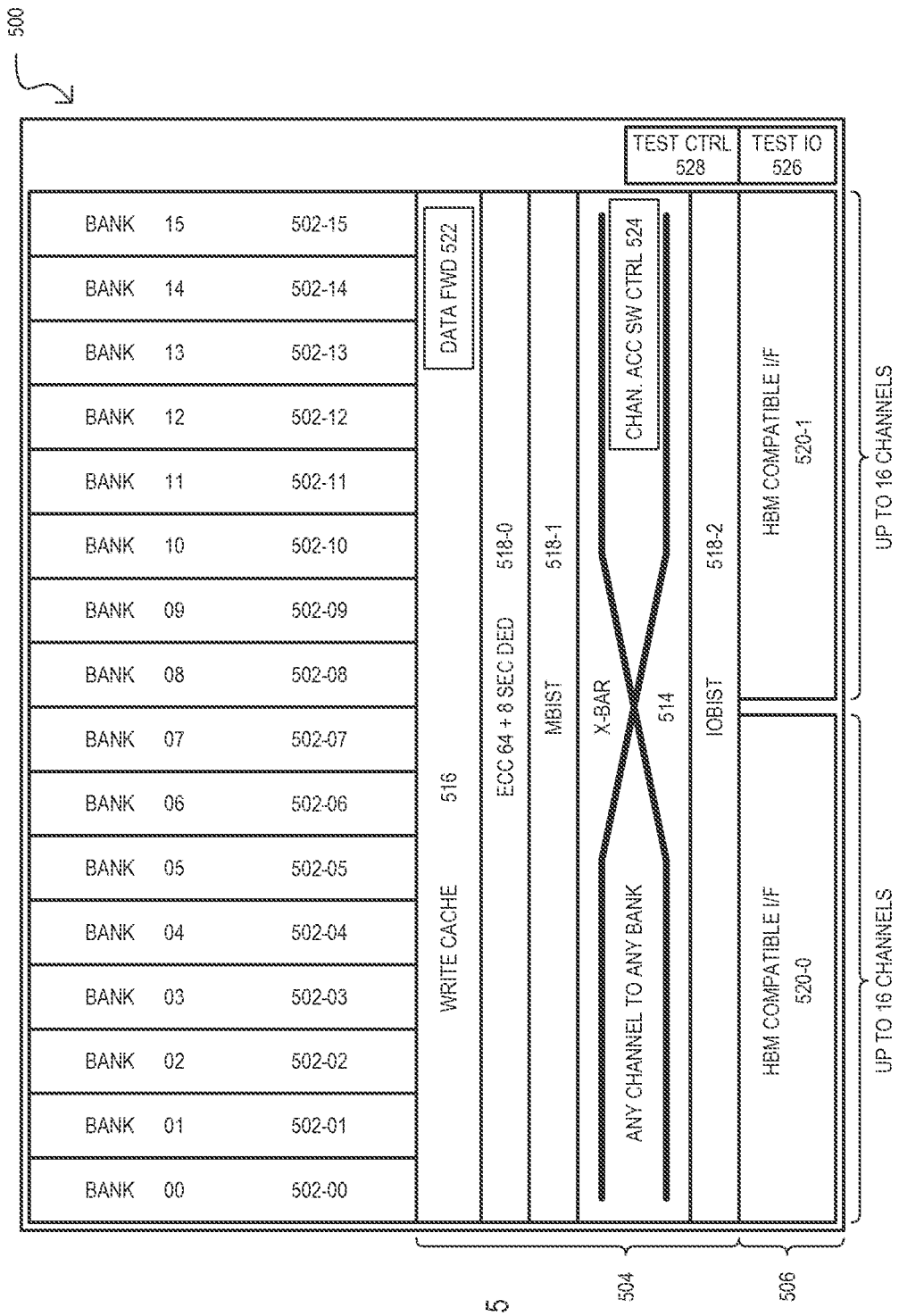
FIG. 5 is a block diagram of an IC according to another embodiment.

FIG. 5 is a block diagram of an IC device 500 according to another embodiment. IC device 500 can include items like those of FIG. 1, and such like items can be subject to the same variations as their counterpart of FIG. 1. In a particular embodiment, IC 500 can be one implementation of that shown in FIG. 1.

In the embodiment of FIG. 5, IC device 500 can include 16 banks 502-00 to 502-15. Banks (502-00 to 502-15) can each be independently addressable and include its own primary and secondary decoders. Each bank (502-00 to 502-15) can include SRAM cells, and allow reads and writes at a data width indicated by each channel.

A controller sub-system 504 can include a write cache 516 with data forwarding logic 522, an error correction section 518-0, memory BIST circuits 518-1, a crossbar circuit 514 and corresponding channel access switch controller 524, and IO BIST circuits 518-2. A write cache 516, as described for embodiments herein, can store write data for previous write cycles. Data forwarding logic 522 can forward write data as read data in the event a read address matches a cached write address.

Error correction section 518-0 can perform error detection and/or correction on write data prior to such data being written into a memory bank and/or perform error detection and/or correction on read data after it has been read from a memory bank. In some embodiments, error correction section 518-0 can perform error correction at a back end of a crossbar circuit 514. That is, write data passes through crossbar circuit before undergoing error detection/correction, and read data undergoes error detection/correction prior to passing through the crossbar circuit). However, in other embodiments, error detection/correction can be performed at a front end of crossbar circuit 514. In a very particular embodiment, error correction section 518-0 can perform single error correction dual error detection (SEC-DED) on 64-bits of data using 8 error correction code (ECC) bits.

Memory BIST circuits 518-1 can enable self-test of memory banks (502-00 to -15). Memory BIST circuits 518-1 can include a structural BIST controller to test a structure of the memory banks (502-00 to -15). In addition, memory BIST circuits 518-1 can also include a functional BIST controller to test operations of memory banks (502-00 to -15).

Similarly, IO BIST circuits 518-2 can enable self-test of interface sub-system 506, including crossbar circuit 514.

An interface sub-system 506 can include two or more high bandwidth memory (HBM) compatible interfaces. FIG. 5 shows two HBM compatible interfaces 520-0/1. The HBM DRAM interface is a dynamic random access memory (DRAM) interface currently being standardized by JEDEC. As will be described in more detail below, the HBM compatible interfaces (520-0/1) can have portions that directly map to the HBM DRAM interface. In the particular embodiments of FIG. 5, Each HBM compatible interfaces 520-0/1 can include up to 16 channels. Thus, an IC device 500 can have from two to 32 different channels that can each access any of the 16 memory banks (502-00 to 15).

IC device 500 also shows test IO 526 and test control circuits 528. A test IO can include IOs for testing IC device

500. Test control circuits 528 can include circuits for executing tests on IC device 500, such as logic and/or chains of test registers. In particular embodiments, test IO 526 and test control circuits 528 can be JTAG boundary scan type test circuits.

Figure 6:
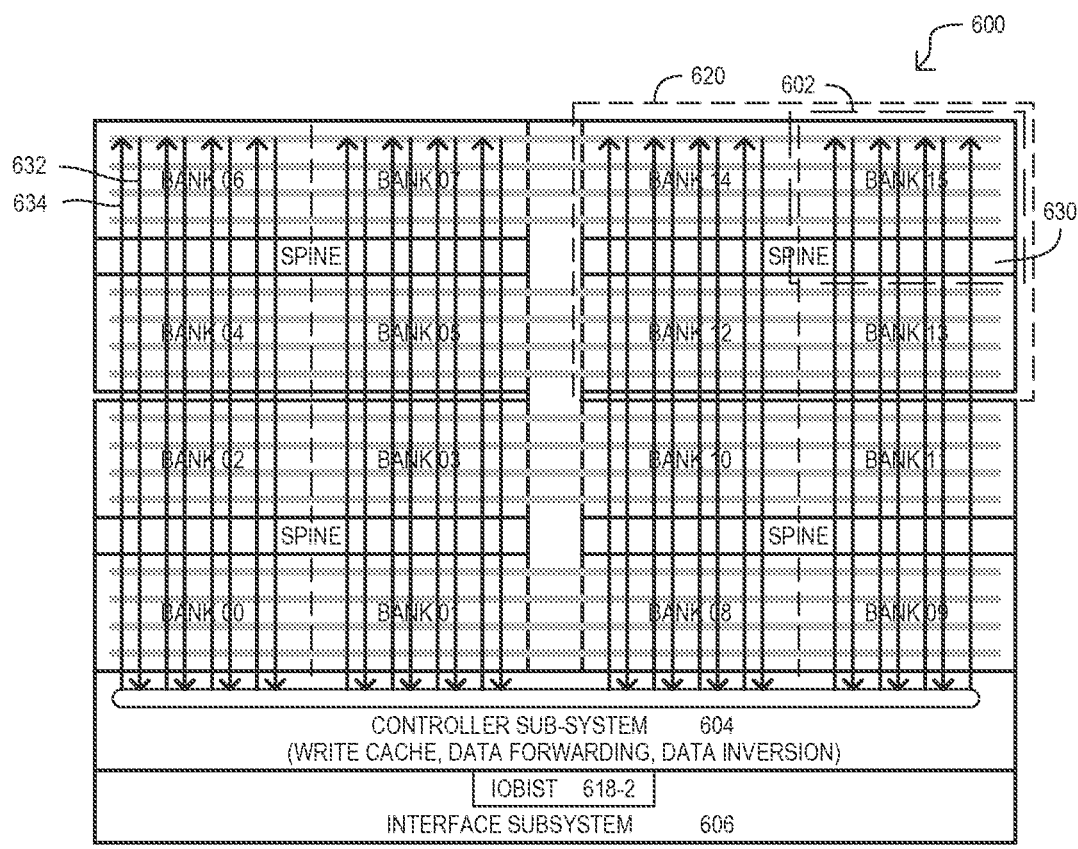
FIG. 6 is a top plan view showing memory "slices" that can be included in an embodiment.

FIG. 6 is a block diagram of an IC 600 according to another embodiment. IC 600 can include items like those of FIG. 4, and such like items can be subject to the same variations as their counterpart of FIG. 4. In a particular embodiment, IC 600 can be one implementation of that shown in FIG. 4.

IC 600 can include four slices (one shown as 620), that each include four memory banks (one shown as 602). Thus, one slice includes memory banks BANK00 to BANK03, another includes memory banks BANK04 to BANK07, another includes memory banks BANK08 to BANK11, and the last slice includes memory banks BANK12 to BANK15. In the embodiment shown, each slice 620 can include a spine section 630 formed between opposing bank pairs. A spine section 630 can route and decode address and control signals to enable access to the banks 602 of the slice.

A slice 620 can allow read and write accesses to each of its banks on dedicated, unidirectional global read data lines (one set shown as 632) and global write data lines (one set shown as 634). In such an arrangement each memory slice 620 can support access by four channels every memory cycle. In one particular embodiment, global read data lines and global write data lines 632/634 can each be 72 bits wide.

In one particular embodiment, a slice 620 can be a fully contained memory sub-array of 72 Mb effective density with additional bits for column and row redundancy. A slice can support a memory core frequency of up to 1500 MHz. A memory slice 620 can also contain metallization to support crossbar switching between 32 channels and 16 banks cross switch with the corresponding switches. In a particular embodiment, a slice can have an effective storage of 72 Mb and a maximum power consumption of 2.5 W. A read latency for a slice 620 can be 5 cycles.

As shown in FIG. 6, IC 600 can also include a controller subsystem 604. Such a sub-system can include items like those of other embodiments herein. In FIG. 6, controller subsystem 604 is shown to include data inversion circuits. In one embodiment, data inversion circuits can be present at a channel access level. In particular embodiments, data inversion can be an optional function enabled by an input or other configuration value. In some embodiments, data inversion can be executed with 8-bit granularity. In one very particular embodiment, if more than 4 bits will transition by application of write data, inversion can be indicated by an inversion bit (DBI). If such a bit is set, write data is inverted as it is written into an array of a memory bank. Likewise, read data is inverted if a read data value has its DBI bit set.

Figure 7:
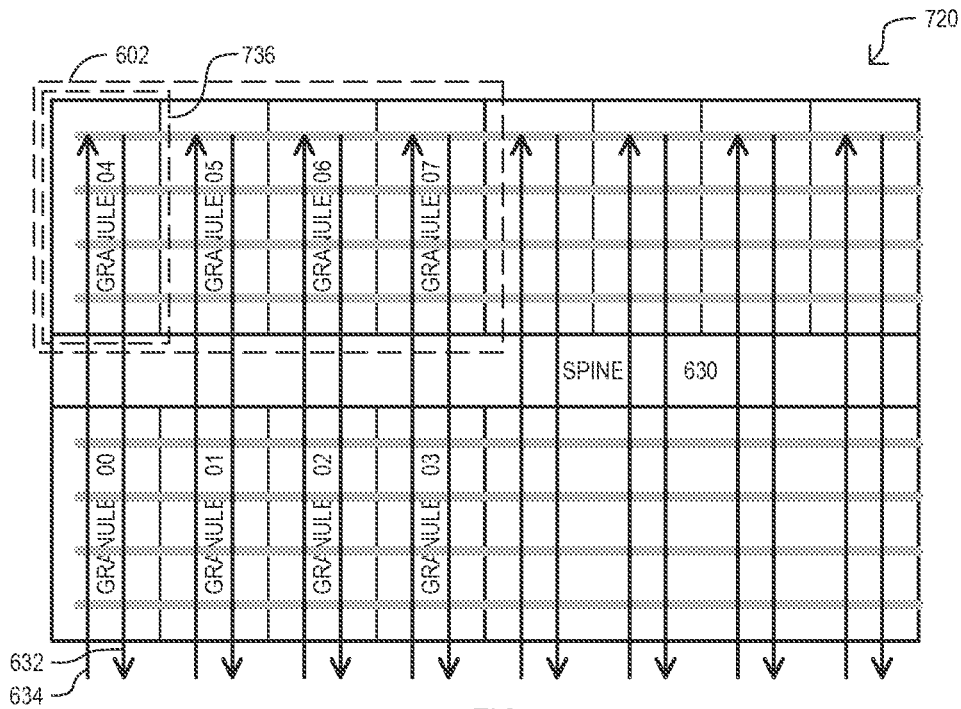
FIG. 7 is a top plan view showing memory banks that can be included in an embodiment.

FIG. 7 is a block diagram of a memory slice 720 according to another embodiment. Memory slice 720 can be one implementation of that shown as 620 in FIG. 6.

FIG. 7 shows a slice 720 with four banks (one shown as 602). As noted in conjunction with other embodiments, each memory bank 602 can be an independently addressable memory array with its own primary and secondary decoders. Each bank 602 can be divided into four granules (one shown as 736). A granule 736 can be a fully contained memory sub-array capable of having one read/write atomic operation active on only one memory row in any memory core cycle.

In a read operation, read data from a granule 736 can be output on corresponding global read data lines 632, and write data can be supplied to a granule 736 on corresponding global write data lines 634. In a very particular embodiment, such global data lines (GDLs) can each be 72-bits wide.

Figure 8:
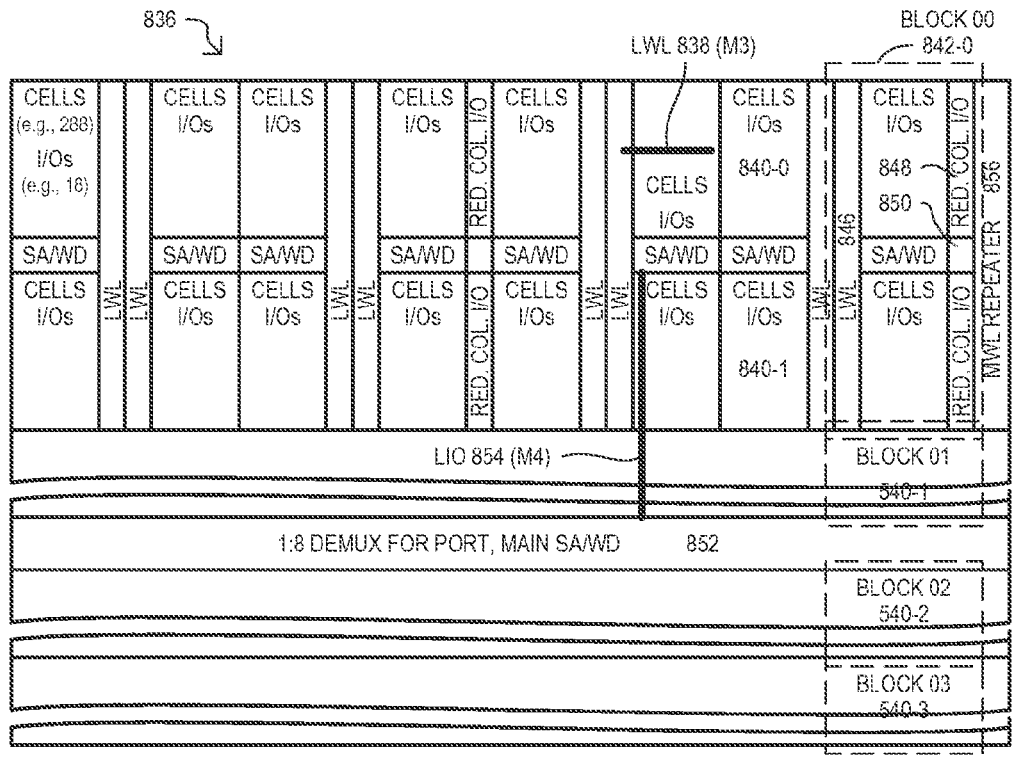
FIG. 8 is a top plan view showing memory "granules" that can be included in an embodiment.

FIG. 8 is a block diagram of a granule 836 according to another embodiment. Granule 836 can be one implementation of that shown as 736 in FIG. 7. A granule 836 can access a group of memory cells in a read or write operation by activating a main word line (MWL) and coded Y address bits. The Y address bits can be decoded within the granule 736 to activate a local word line (LWL, one shown as 838) and execute column multiplexing (MUXing) to enable access to a group of cells.

In FIG. 8, granules 836 can be divided into blocks (four shown 842-0 to 842-3). In FIG. 8, a granule 836 can include four groups of eight blocks (four shown 842-0 to 842-3). Each block 842 can include a top sub-block 840-0 separated from a bottom sub-block 840-1 by a bank of local sense amplifiers (SAs) and local write drivers (WD) (one shown as 844). Local word line drivers 846 can drive local word lines (one shown as 838) in each block. Blocks 840 can include SRAM cells and IOs circuits for such cells. In granule 836, every groups of four blocks can end (going in a horizontal direction) with redundant columns/IOs 848 and redundant SAs/WDs 850. Rows of blocks can each end with a main word line repeater 856.

A granule 836 can encapsulate atomic read/write operations and use hierarchical sensing for high speed sensing. Local SAs/WDs 844 can be connected to main SAs/WDs of main SA section 852 by local IOs (LIOs, one shown as 854). In the particular embodiment shown, main SA section 852 can also provide 1:8 de-MUXing to enable IOs to be connected to IO ports of granule 836.

In a very particular embodiment, there can be one local SA (LSA) for 512 rows and 8 redundant rows (i.e., each block includes 520 rows). A local SA can be shared between sub-blocks, thus local SAs can sense sensing 256 rows and 4 redundant rows at a given time. In such an arrangement, there can be a main SA for every 2K rows and 32 redundant rows.

In a particular embodiment, each granule 836 can have an effective storage size of 4.5 Mb. A granule 836 can have 2K cell rows (and 32 redundant rows) and 2336 cell columns. Groups of 16 columns can correspond to one bit of IO. LWLs 838 can be realized with a third level of metallization (M3), while LIOs 854 can be realized with a fourth level of metallization (M4).

Figure 9:
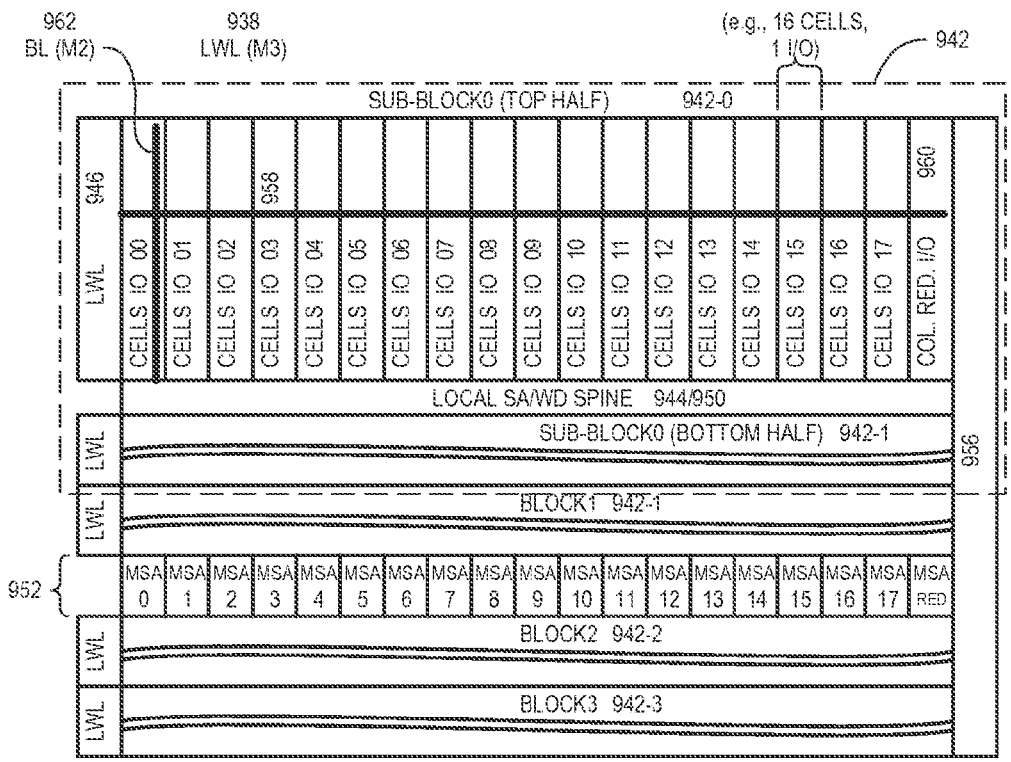
FIG. 9 is a top plan view showing memory bocks that can be included in an embodiment.

FIG. 9 is a block diagram of blocks 942-0 to 942-03 of a granule in a vertical (i.e., column) direction. Blocks (942-0 to 942-03) can be one implementation of those shown as 842-0 to 842-3 in FIG. 8. In FIG. 9, a block 942-0 can be divided into 18 regular IO groups (one shown as 958) and one redundant IO group 960. Each IO group 958/960 can provide one data IO for the block. IO groups (958/960) can include bit lines (one shown as 962) extending in a vertical direction to local SA/WD 944 (or redundant SA/WD 950 in the case of a redundant IO group).

A width of a block 942-0 can correspond to a length of a LWL 938 and is selected for a desired performance. In the embodiment shown, a LWL 938 can span the 18 regular IO groups 958 and one redundant IO group 960 (i.e., 304 cells). Blocks without redundant IO sections can provide 18 IOs, while blocks with redundant sections (i.e., 942-0) can provide 19 IOs. A LWL 938 can be driven by a local word line driver 946.

A main SA section 952 can include main SAs and WDS as described above. There can be one main SA/WD for each IO group (958/960).

In a particular embodiment, each IO group (958/960) can have 256 cells rows, four redundant rows, and 16 columns.

LWLs 938 can be realized with a third level of metallization (M3), while bit lines 962 can be realized with a second level of metallization (M2).

Figure 10:
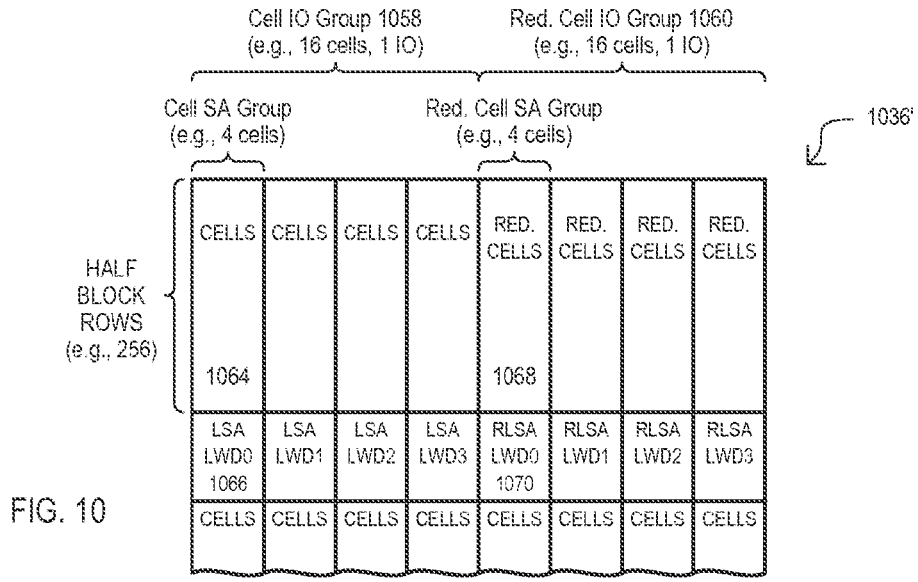
FIG. 10 is a top plan view showing memory cell input/output groups that can be included in an embodiment.

FIG. 10 is a block diagram of a portion of a granule 1036' showing a more detailed view of a regulator IO group 1058 and redundant IO group 1060 according to an embodiment. Granule portion 1036' can show one implementation IO groups shown as 958 and 960 in FIG. 9. FIG. 10 shows a regular IO group 1058 and a redundant IO group 1060. Regular IO group 1058 can have cells divided in a vertical (i.e., column) direction into regular SA cell groups (one show as 1064). Similarly, redundant IO group 1060 can have cells divided in a vertical direction into redundant SA cell groups (one show as 1068). Memory cells of each regular SA cell group 1064 can be read from and written to by a local SA/WD 1066, and memory cells of each redundant SA cell group (one shown as 1068) can be read from and written to by a local redundant SA/WD (one shown as 1070).

Figure 11:
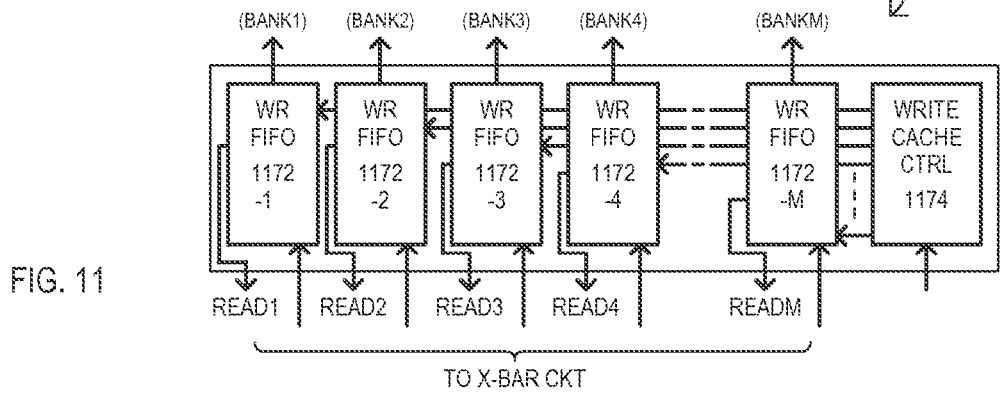
FIG. 11 is block diagram representation of a write buffer circuit that can be included in embodiments.

FIG. 11 is a block diagram representation of a write cache 1116 that can be included in embodiments. A write cache 1116 can include a number of first-in-first-out (FIFO) type write buffers (1172-1 to 1172-M) can be arranged with a bank granularity. That is, write data, and optionally the write address, can be stored on a per bank basis, and forwarded to a corresponding bank. A write cache control 1174 can receive write addresses, and can control the propagation of write data/write addresses through write buffers (1171-1 to 1172-M). In addition, write cache control 1174 can determine when a read address matches a cached write address, and can output the corresponding cached write data as read data (READ1 to READM).

Write buffers (1172-1 to 1172-M) can operate with a deterministic latency, providing data to a corresponding bank in a write operation within a predetermined number of cycles of a periodic clock.

In the embodiment shown, write buffers (1172-1 to 1172-M) can receive write data/write addresses via a crossbar circuit.

Figure 12:
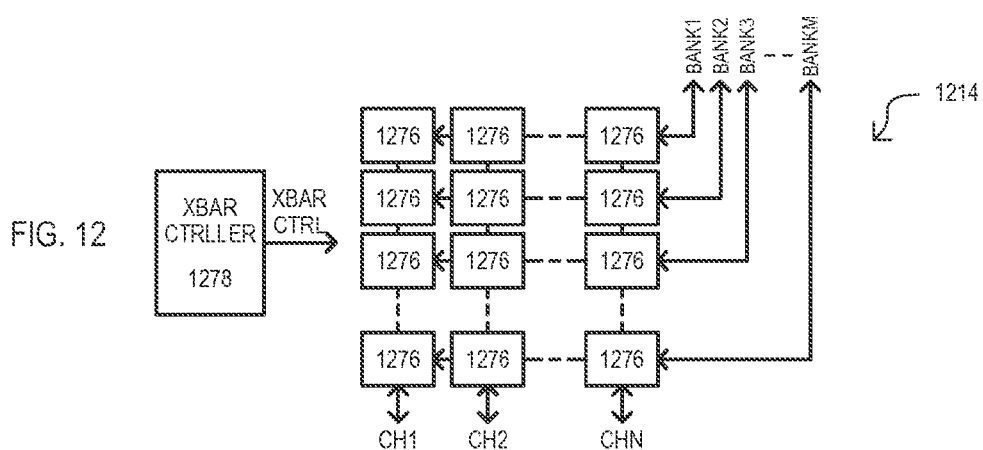
FIG. 12 is block diagram representation of a crossbar circuit that can be included in embodiments.

FIG. 12 is a block diagram representation of a crossbar circuit 1214 that can be included in embodiments. A crossbar circuit 1214 can have crossbar switches 1276 than can enable a data/address path between any channel (CH1 to CHN) and any bank (BANK1 to BANKM). Crossbar switches 1276 can be controlled by a crossbar control circuit 1278, which can generate control signals XBAR CTRL in response to address data, such as bank address data.

In a particular embodiment, crossbar circuit 1214 can accommodate a maximum number of channels (Mmax), but is configurable to allow switching between a smaller number of channels to a same, or smaller number of blocks. In some embodiments, such a switching can enable a larger data width channels. For example, if a data width for Mmax channels is Q, a data width can be 2*Q for a crossbar circuit 1214 configured for Mmax/2 channels.

In one embodiment, a crossbar circuit 1214 can provide switching between 32 channels and 16 banks.

Figures 13, 14A:
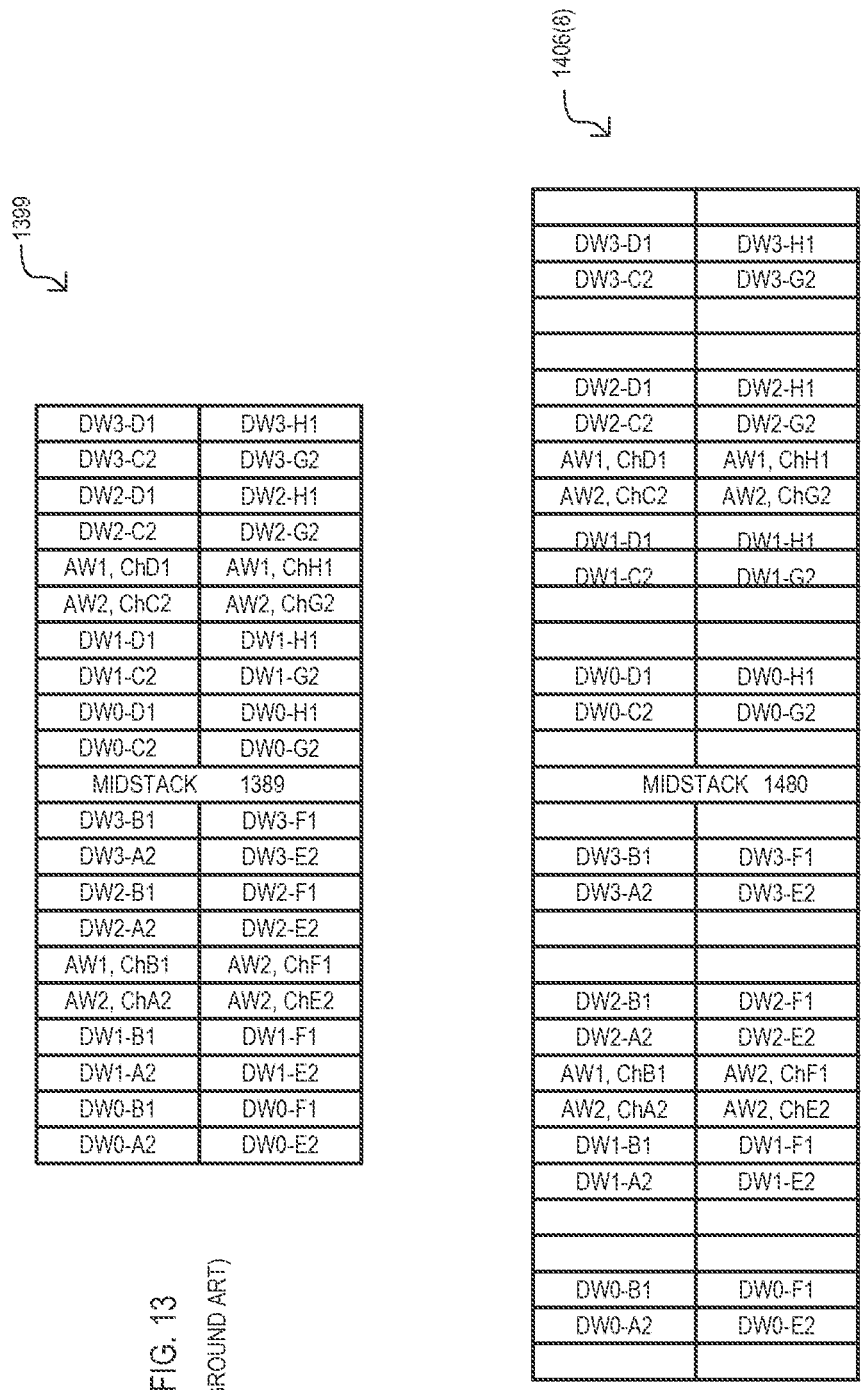

FIG. 13 shows a diagram for a high band width memory dynamic RAM (DRAM) (HBM DRAM) interface 1399. It is understood that within each rectangular section there can be a number of physical connections for contact with an interposer, or the like. Sections DWx-YY are data IO groups, where x identifies a data word, and YY identifies the channel for the data word. Thus, DW0-E2, DW1-E2, DW2-E2 and DW3-E2 are data words for channel E2. Such data words can have a width of 32 bits (and can include ECC bits in addition). Sections AW2, Ch YY and AW1, Ch YY are address and control inputs for each channel. A MIDSTACK section 1389 can include additional control inputs or outputs for a DRAM.

FIGS. 14A to 14C show an HBM-compatible SRAM interface configured for various channel sizes. FIG. 14A shows HBM-compatible interface 1406(8) configured for eight channels: ChA2, ChB1, ChC2, ChD1, ChE2, ChF1, ChG2 and ChH1. Each such channel can have four data words, and such data words are designated in the same way as FIG. 13. HBM-compatible interface 1406(8) can include a midstack section 1480 that can include additional inputs/outputs for the SRAM.

FIG. 14B shows HBM-compatible interface 1406(16) configured for 16 channels. Interface 1406(16) includes the same channels as FIG. 14A, but adds the following channels: ChA1, ChB2, ChC1, ChD2, ChE1, ChF2, ChG1 and ChH2. In such an arrangement, each channel can have two data words.

FIG. 14C shows HBM-compatible interface 1406(32) configured for 32 channels. Interface 1406(32) includes the same channels as FIG. 14C, but adds the following channels: ChA0, ChA3, ChB0, ChB3, ChC0, ChC3, ChD0, ChD3, ChE0, ChE3, ChF0, ChF3, ChG0, ChG3, ChH0 and ChH3. In such an arrangement, each channel can have one data word.

In some embodiments, each data word can include no less than 32 connections (and can include ECC bits in addition). Further, in some embodiments, address control sections (i.e., AWi, Ch YY) can have more address inputs than in an HBM DRAM interface by using connections that are unused in the HBM DRAM configuration as address inputs.

In this way, an SRAM interface can be compatible with an HBM DRAM interface, but capable of accommodating a larger number of channels than an HBM DRAM interface.

Figure 15:
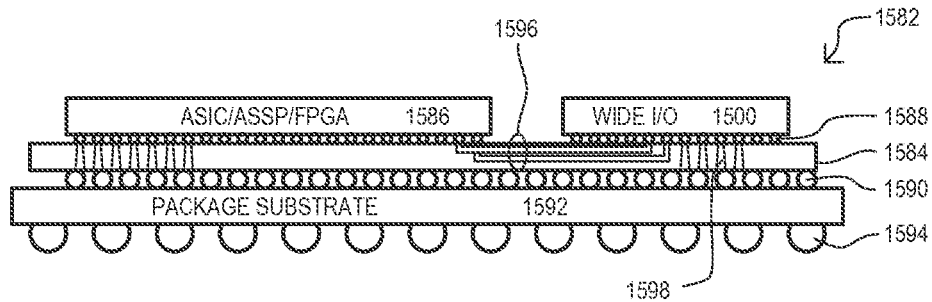
FIG. 15 is a side cross sectional view of an IC device according to an embodiment.

FIG. 15 is a side cross sectional view of an IC device 1582 according to an embodiment. An IC device 1582 can be a multichip module that includes a memory IC 1500, one or more other ICs 1586, an interposer 1584, and a package substrate 1592. In particular embodiments, IC device 1582 can be a "2.5D package".

A memory IC 1500 can provide switching between multiple channels and multiple memory banks as described herein, or equivalents. Further, memory IC 1500 can include a wide IO as described herein, including a HBM-compatible interface. Memory IC 1500 can have physical and electrical contact with interposer 1584, via first connections 1588. Further, memory IC 1500 can have electrical connections to other IC 1586 via routing layers 1596 within interposer 1584. Other IC 1586 can also have physical and electrical contact with interposer 1584 via first connections 1588.

Interposer 1584 can provide electrical connections between ICs (e.g., 1500, 1586) via first connections on a first surface. Interposer 1584 can include second connections 1590 on a second surface, opposite to the first surface. In the embodiment shown, interposer 1584 can include vias 1598 connecting second connections 1590 to first connections 1588. In one embodiment, such vias 1598 can be power supply connections for the ICs (e.g., 1500, 1586).

Package substrate 1592 can provide electrical paths between second connections 1590 and package connections 1594.

In one embodiment, a memory IC 1500 can be an SRAM device with up to 16 banks and up to 32 channels, accessed via an HBM-compatible interface connected to interposer 1584. Memory IC 1500 can be a "known good die" KGD type package. The other IC 1586 can be an application specific IC (ASIC), application specific standard product (ASSP), or programmable logic device, such as a field programmable gate array (FPGA). Interposer 1584 can be a silicon interposer, and vias 1598 can be through silicon vias (TSVs). First connections 1588 can be micro bump connections having a pitch of about 55 um and a size of about 25 um. Second connections can be C4 bumps having a pitch of about 200 um and solder ball size of about 150 um. Package connections 1594 can be solder balls having a pitch of about 200 um and a size of about 1 mm.

In particular embodiments, IC 1586 can utilize memory IC 1500 for packet processing functions, including but not limited to network analytics and/or packet buffering. In particular, IC device 1582 can perform packet lookup functions, packet statistic/state storage an update, as well as packet scheduling. In addition or alternatively, an IC device 1582 can be a MAC framer and provide head-to-tail caching.

Figure 16:
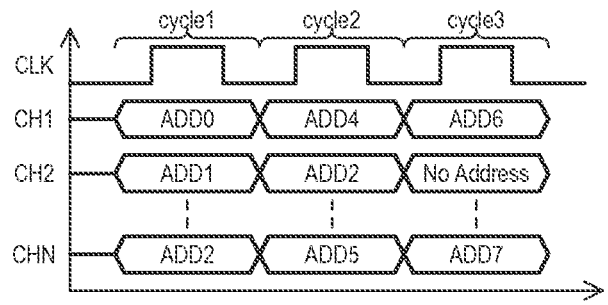
FIG. 16 is a timing diagram showing access operations that occur through a physical interface according embodiments.

FIG. 16 shows access operations of an IC device according to an embodiment. In a very particular embodiment, FIG. 16 shows operations of the IC devices shown in any of FIGS. 1-12. FIG. 16 is a timing diagram showing waveforms for a timing clock (CLK) and address values (ADDx, where x is a number) for a number of memory channels (CH1 to CHN). As shown, each cycle (cycle1, cycle2, cycle3) each channel can receive an address value to access a memory storage location. The address values (ADDx) are understood to be complete addresses to enable an access for that channel to start in that cycle.

It is understood that while an IC device and access method can include receiving address values (ADDx) on every channel for consecutive cycles, this represents a high RTR operation. In operation, some (or all) channels may not receive address values, as shown for channel CH2 in cycle 3. In some embodiments, address values (ADDx) can be received at a double data rate (DDR), with a first portion of the address received during one portion of a clock cycle, and another portion of the address being received on another portion of the same clock cycle. However, in other embodiments, addresses can be a single value received at one portion of the clock cycle (i.e., single data rate, SDR).

Figure 17:
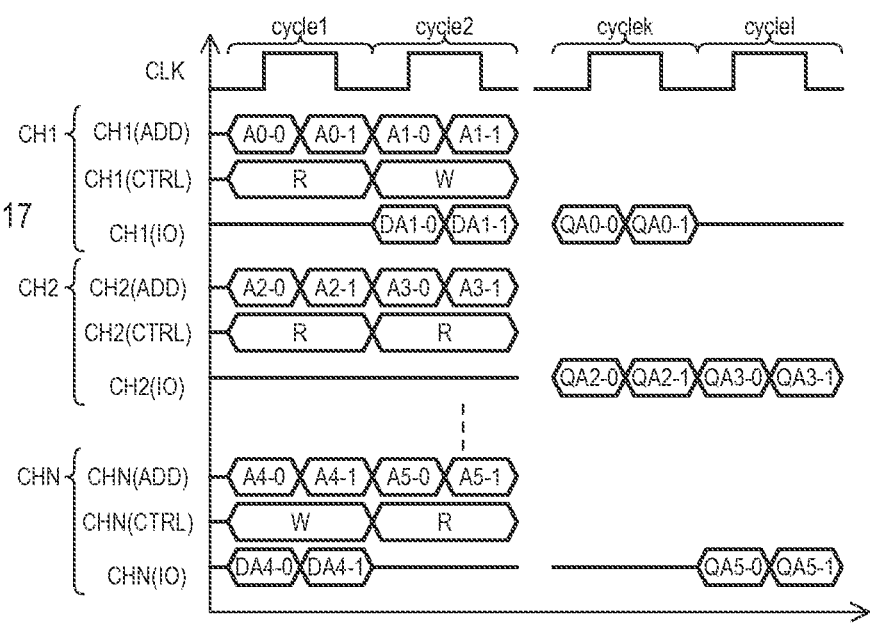
FIG. 17 is a timing diagram showing access operations that occur through a physical interface according a particular embodiment.

FIG. 17 is a timing diagram showing an IC device access operation according to another embodiment. In a very particular embodiment, FIG. 17 shows operations of IC devices shown in any of FIGS. 1-12. FIG. 17 shows a timing clock (CLK) as well as address values (CHy(ADD)), control values (CHy(CTRL)) and data values (CHy(IO)), for a number of memory channels (where y identifies the channel).

In the embodiment of FIG. 17, address values can be DDR values. For example, the address values A0-0 and A0-1 received for channel CH1 during cycle 1 are two parts of a complete address for accessing a storage location within an SRAM IC device. In contrast, control inputs are single data rate. For example, CH1 shows a read operation (R) initiated for channel CH1 in cycle1 and write operation (W) initiated for channel CH1 in cycle 2. Channel CH2 undergoes two read operations in these two cycles, channel CHN undergoes a write operation followed by a read operation in these two cycles. Read and write data values can be DDR values. For example, the read data values for the read operation to channel CH1 at cycle1 can be output as QA0-0 and QA0-1 during cycle k, while the write data values for the write operation to channel CH1 at cycle2 can be applied as DA1-0 and DA1-1 during cycle2. The remaining accesses via the other channels are understood from the above description.

The accesses shown in FIG. 17 are but provided by way of example. According to embodiments, in a given cycle any number of channels can be active or all channels can be inactive. It is understood that while data values are DDR values in FIG. 17, in alternate embodiments, data values can be SDR values. In addition or alternatively, in alternate embodiments, connections for read data can be separate from connections for write data (i.e., data paths are not bidirectional).

Embodiments herein can provide a wide IO memory device having a large number of memory banks and a large number of channels to access such memory banks. In particular embodiments, a memory device can support up to 32 channels to access up to 16 banks. In some embodiments, any of multiple channels can access any of multiple banks.

It should be appreciated that references throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An integrated circuit (IC) device, comprising:
M memory banks, where M is greater than 2, and each memory bank is separately accessible according to a received address value;
N channels, where N is greater than 2, and each channel includes its own data connections, address connections, and control input connections for executing a read or write access to one of the memory banks in synchronism with a clock signal, and wherein each channel is configured to transfer greater than one bit on each read or write access; and
a controller subsystem configured to control accesses between each channel of the N channels and each memory bank of the M memory banks, and wherein the controller subsystem is configured to control a first access on every channel of the N channels during a first cycle of the clock signal, wherein each access of the first access on every channel is responsive to a different memory address, and control a second access on every channel of the N channels during a second cycle of the clock signal wherein the first cycle and the second cycle are consecutive cycles of the clock signal.

2. The IC device of claim 1, wherein:
M is no less than 8.

3. The IC device of claim 1, wherein:
each bank includes a plurality of static random access memory cells.

4. The IC device of claim 1, wherein:
N is no less than 8.

5. The IC device of claim 1, wherein:
the data connections of each channel include no less than 32 bi-directional data connections.

6. The IC device of claim 1, wherein:
the controller subsystem includes a cross-bar circuit configurable to enable a data access between any channel and any bank.

7. The IC device of claim 1, wherein:
the controller subsystem includes
a write cache partitioned into write data buffers corresponding to each bank, and
data forwarding logic configured to forward a most recently received write data value for a bank as read data from the bank.

8. An integrated circuit (IC) device, comprising:
M memory banks, where M is greater than 2, and each memory bank is separately accessible according to a received address value;
N channels, where N is greater than 2, and each channel includes its own a data connections, address connections, and control inputs connections for executing a read or write access to one of the memory banks, wherein each channel is configured to transfer greater than four bits per clock cycle; and
a controller subsystem configured to enable accesses between each channel of the N channels and each memory bank of the M memory banks.

9. The IC device of claim 8, wherein:
the controller subsystem enables accesses up to an access on every channel on consecutive cycles of a clock signal.

10. The IC device of claim 8, wherein:
the data connections of the N channels are configured as double data rate connections, latching write data on in synchronism with rising and falling edges of a periodic clock and outputting read data on in synchronism with rising and falling edges of the periodic clock.

11. The IC device of claim 8, wherein:
the controller subsystem includes a circuit operable to connect at least address data from every channel to address decoders within every memory bank.

12. The IC device of claim 8, wherein:
the controller subsystem includes
a write cache partitioned into write data buffers corresponding to each bank, and
data forwarding logic configured to forward a most recently received write data value for an address of a bank as read data to the address of the bank.

13. The IC device of claim 8, wherein:
M is no less than 8; and
N is no less than 8.

14. The IC device of claim 8, wherein:
each memory bank is subdivided into plurality of slices, each slice including a plurality of uni-directional read data lines configured to output read data from memory cells of the slice and uni-directional write data lines configured to receive write data from one of the channels.

* * * * *